US006926190B2

(12) United States Patent
Jiang et al.

(10) Patent No.: US 6,926,190 B2
(45) Date of Patent: Aug. 9, 2005

(54) INTEGRATED CIRCUIT ASSEMBLIES AND ASSEMBLY METHODS

(75) Inventors: Tongbi Jiang, Boise, ID (US); Tsuyoshi Yamashita, Wilmington, NC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/106,009

(22) Filed: Mar. 25, 2002

(65) Prior Publication Data

US 2003/0178474 A1 Sep. 25, 2003

(51) Int. Cl.⁷ .............................................. B23K 31/02
(52) U.S. Cl. .................. 228/180.22; 228/206; 228/215
(58) Field of Search .......................... 228/180.22, 245, 228/246, 205, 206, 214, 215; 257/737, 738; 438/613

(56) References Cited

U.S. PATENT DOCUMENTS

| 4,921,157 A | * | 5/1990 | Dishon et al. ............ 228/124.1 |
| 5,000,819 A | * | 3/1991 | Pedder et al. ................. 216/69 |
| 5,345,056 A | * | 9/1994 | Frei et al. ............... 219/121.59 |
| 5,609,290 A | * | 3/1997 | Bobbio et al. ............... 228/206 |
| 5,930,598 A | * | 7/1999 | Wille et al. .................. 438/108 |
| 5,975,408 A | * | 11/1999 | Goossen ................... 228/173.2 |
| 5,988,485 A | * | 11/1999 | Master et al. .......... 228/180.22 |
| 6,228,678 B1 | * | 5/2001 | Gilleo et al. ................. 438/108 |
| 6,250,540 B1 | * | 6/2001 | Egitto et al. ................. 228/205 |
| 6,293,456 B1 | * | 9/2001 | MacKay et al. ............. 228/254 |
| 6,367,150 B1 | * | 4/2002 | Kirsten ......................... 29/840 |
| 6,467,676 B1 | * | 10/2002 | Wang ..................... 228/180.22 |
| 6,475,828 B1 | * | 11/2002 | Hoang ......................... 438/108 |

FOREIGN PATENT DOCUMENTS

| JP | 11340614 | * | 12/1999 | |
| JP | 2000-22318 A | * | 1/2000 | |
| JP | 200022318 A | * | 1/2000 | |
| JP | 2000022318 A | * | 1/2000 | |
| JP | 2000022318 A | | 1/2000 | ............ H05K/3/34 |
| JP | 2000-208913 A | * | 7/2000 | |
| JP | 2001308144 A | * | 11/2001 | |

\* cited by examiner

*Primary Examiner*—Kiley S. Stoner
(74) *Attorney, Agent, or Firm*—Schwegman, Lundberg, Woessner & Kluth, P.A.

(57) ABSTRACT

A method for assembling chips onto substrates includes applying a flux-free, no-flow underfill material. In an embodiment, the method includes removing oxide from interconnects without the use of a flux and applying a flux-free, no-flow underfill. In an embodiment, the method includes removing oxide from bumps, applying no-flow underfill to a substrate, and fluxlessly connecting the bumps to pads on the substrate. In an embodiment, oxide is removed from the bumps by a plasma treatment. In an embodiment, oxide is removed from the bumps by a subjecting the bumps to an oxide reduction process. The assembly of the chips and substrate is free from flux residue and/or flux cleaning solution residue.

45 Claims, 6 Drawing Sheets

INTEGRATED CIRCUIT ASSEMBLIES AND ASSEMBLY METHODS

FIELD OF THE INVENTION

The present invention generally relates to an integrated circuit assembly and a method of integrated circuit device assembly. More specifically, the present invention relates to chip to substrate assembly without the use of flux.

BACKGROUND OF THE INVENTION

One aspect of manufacturing an integrated circuit chip or die is mounting the integrated circuit chip to a substrate. In today's technological environment, there is a continuously increasing desire to increase integration of circuits onto a single semiconductor chip. At the same time there is a requirement to increase performance of the chip, whether it is a memory chip, processor chip, telecommunication chip or other integrated circuit chip. As more functions are integrated into a chip, the number of interconnections to other chips and/or electrical devices increases. Often, the goal is to provide the chip with as many input/output ("I/O") terminals as possible. But the addition of I/O terminals must be provided at a reasonable cost. Flip-chip bonding is one of various surface mounting techniques which have been developed in an effort to provide high density interconnections between the chip and the substrate.

In the flip-chip bonding process, the die containing the integrated circuit is mounted directly to the substrate. Generally, the flip-chip process entails disposing a plurality of solder bumps on the upper-surface of the die, flipping the die and mating these solder bumps with corresponding bonding pads located on the substrate, and then heating the die and the substrate so as to reflow the solder bumps. Once reflowed each bump forms a bonded joint between the die and the substrate, which functions as both an electrical and physical contact. More specifically, the flip-chip bonding process includes three basic steps: (1) pre-cleaning and deoxidation of the surface oxides; (2) solder reflow and/or reflow joining; and (3) post-soldering cleaning.

Known flip-chip bonding processes suffer from various drawbacks. For example, the controlled collapse chip connection ("C4") flip-chip bonding process utilizes solder bumps comprising a lead-tin alloy, which require an activating flux to reduce the oxides which form on the surface of the bump. The oxides interfere with the formation of an adequate bond due to their relatively high melting points. Accordingly, oxides must be removed if an adequate bond between the die and the substrate, i.e., the solder bumps and bonding pads, is to be obtained. However, the use of flux leaves a residue. The residue must be removed in order to provide an adequate surface to which the underfill is adhered, prevent voiding, prevent corrosion or reduce the potlife of the underfill between the die and the substrate. Such removal or cleaning is a difficult process to accomplish due to the small and ever decreasing size of micro-electronic components. Additionally, there are difficulties in removing the cleaning agents, flux, or residue from the minute areas between components. Moreover, the cleaning agents may damage some components and may pose an environmental disposal problem. Some conventional residues include ionic (e.g., acidic or basic) substances. Some residues are corrosive. Some residues hydrolyze into corrosive components in the presence of moisture, which can lead to corrosion of the parts soldered or to damage to the surrounding components. Accordingly, the cleaning step adds both time and cost to the manufacturing process. Furthermore, the use of the lead-tin alloy is often unsatisfactory because of its tendency to fracture due to thermal stress. The C4 flip-chip bonding process also exhibits surface tension between the solder bump and the bonding pad, which disadvantageously functions to limit the minimum allowable distance between solder bumps.

Another drawback associated with the C4 process is that for proper operation the minimum allowable size of the solder bumps range from 3–5 mils. Notwithstanding the fact that the size of the solder bumps cannot be further reduced (a further reduction would allow more bumps per area), since the entire solder bump becomes liquid during the bonding process, the substantial size of the bump increases the probability of a bump forming a short circuit with one or more adjacent bumps during the bonding process.

Another known flip-chip bonding process can be referred to as the indium-bump process. In this process, the solder bump including indium formed on the die is brought into contact with the bonding pad on the substrate, and then heated so as to cause the solder bump to reflow and form a solder joint. While, this process does not rely on surface tension to assist in the alignment process, the materials utilized for the solder bumps still require the use of flux to remove the oxides prior to the reflow process. As such, the indium-bump process suffers from the same drawbacks as set forth above. Additionally, indium melts at 120 degrees C. and thus uses a large portion of the chip's thermal budget. Accordingly, once the reflow process is completed, further high temperature operations are prohibited. Furthermore, the indium joint, which bonds the die to the substrate, has a relatively low strength. As such, the bond is susceptible to fractures resulting from forces applied during subsequent processing techniques and/or during normal operating conditions.

In addition to the aforementioned problems, some conventional flip-chip bonding processes do not allow for the formation of a hermetic seal surrounding the integrated circuit die simultaneously with the bonding of the die to the substrate. This results from the need to remove the flux from the bonds formed during the flip-chip bonding process. However, while the C4 process allows the generation of a hermetic seal, the seal formed is undesirably large, typically on the order of 250 microns, with reference to today's emphasis on reducing package size.

Various attempts at fluxless soldering have been made but with limited success. For example, U.S. Pat. No. 4,921,157 discloses a fluxless soldering process for semiconductor devices. In this process solder surface oxides are removed using a plasma process. Solder having a surface oxide layer is deposited onto a surface and flourine-containing plasma excitation is performed on the solder. The solder is then reflowed. U.S. Pat. No. 5,407,121 discloses a method of soldering a copper layer without the use of fluxing agents by exposing the copper layer to a fluorine-containing plasma. Solder is then placed onto the surface of the copper layer and reflowed. Reflow can take place at relatively low temperatures, atmospheric pressure and in an inert or oxidizing atmosphere using standard reflow equipment. Still these attempts fall short of providing an adequate chip to substrate packaging technique. Therefore, there remains, in view of these prior attempts, a need in the art for an improved fluxless chip to substrate assembly technique or process.

Flux residues cause further drawbacks when a capillary underfill is used to fill the void between a chip and a substrate. Flux residues interfere with the adhesion of the capillary underfill to the surface of either the substrate or chip that has the flux residue. Moreover, flux residue in the presence of capillary underfill causes remnant voids between the chip and substrate due to the flux residue interfering with the capillary underfill completely filling the void between the chip and substrate. The flux residue must be completely removed to prevent these drawbacks. However, conventional residue cleaning techniques limits the use of capillary underfills to large dimension for the chip-substrate assembly. That is, adequately cleaning residue from the chip and substrate becomes difficult in small dimension chip-substrate assemblies. Moreover, cleaning small dimension assemblies takes a significantly longer time. Thus, cleaning flux residue from small dimension chip-substrate assemblies is not practical from a manufacturing viewpoint.

SUMMARY OF THE INVENTION

The present invention includes a method for assembling chips containing an integrated circuit onto substrates. The present invention is directed to joining a chip to a substrate using a no-flow underfill without the use of a flux. The oxides are removed before joining. Therefore, there is no flux in the underfill and no flux residue cleaning step is required before the underfill is applied between the chip and substrate.

An embodiment of the invention includes applying a no-flow underfill and not applying a flux to the interconnects of at least one of the substrate and the die. In an embodiment, the method includes removing oxide from bumps without the use of a flux, applying no-flow underfill to a substrate, and fluxlessly connecting the bumps to pads on the substrate. In an embodiment, the no-flow underfill is applied to the substrate before the bumps are connected to pads of the substrate. In an embodiment, the pads are on the die and the bumps are on the substrate. In an embodiment, oxide is removed from the bumps by a plasma treatment. In an embodiment, oxide is removed from the bumps by a subjecting the bumps to an oxide reduction process. The oxide reduction process, in an embodiment, occurs in a reduction oven. In an embodiment, the oxide reduction process is a thermal treatment. The methods as described herein are, in some embodiments, particularly suited for flip-chip assembly. An embodiment of the present invention includes reflowing interconnects between a die and a substrate at a temperature less than the temperature for curing a no-flow underfill that is between the die and the substrate.

In an embodiment, the present invention includes an assembly of a die and substrate with a no-flow underfill between the die and substrate. An embodiment of the assembly includes joints between the die and the substrate having a height of less than 100 microns. In an embodiment, the joints have a height of greater than 75 microns. In an embodiment, the joints have a height of less than 75 microns. In an embodiment, the joints have a height on the order of nanometers. In an embodiment, the void between the substrate and the die is free of cleaning solution residue as such cleaning solutions are not used to remove flux or oxides according to the teachings of the present invention.

The present invention further includes equipment for performing the methods as described herein and structures created according to the teachings of the present invention. Further embodiments of the invention include chip/substrate structures and methods of varying scope, as well as apparatus, devices, modules and systems making use of such chip/substrate structures and methods. Such further embodiments will be apparent to one of skill in the art upon reading and understanding the present disclosure.

DETAILED DESCRIPTION

Figure 1:
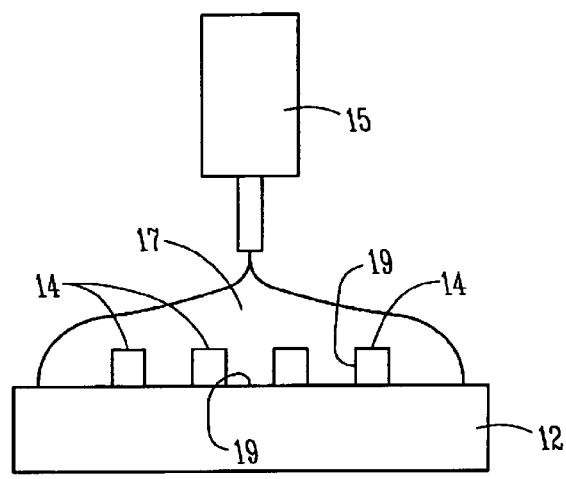
FIG. 1 is a view of a substrate in a step according to the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized. Structural, logical, and electrical changes may be made without departing from the scope of the present invention.

The term wafer used in the following description includes any structure having an exposed surface which is used to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term substrate also refers to structures to which a die from a wafer, e.g., a flip-chip, is connected. Examples of such substrates include surface mount structures, printed circuit boards or other IC support structures. The term conductor is understood to include semiconductors. The term insulator is defined to include any material that is less electrically conductive than the materials referred to as conductors. The phrase no-flow underfill refers to underfill material used in a process that does not rely on capillary forces to fill a void between a die and a substrate. The following detailed description is, therefore, not to be taken in a limiting sense, and the scope of the present invention is defined only by the appended claims, along with the full scope of equivalents to which such claims are entitled.

Integrated circuit fabrication, such as flip-chip fabrication, includes forming a plurality of integrated circuits on a wafer. In some embodiments, the integrated circuits form a memory device, such as a DRAM, SRAM, or RDRAM. By way of example, the memory device is a memory device as described in U.S. Pat. Nos. 6,223,253; 6,219,283; 6,212,123; or 6,211,015, all assigned to Micron Technology, Inc. and all incorporated herein for any purpose. In an embodiment, solder bumps are formed on the wafer. The wafer is diced into individual chips each having a plurality of solder bumps. The solder bumps are then used as electrical connections between the circuits of the die and external circuits through a substrate.

Figure 2:
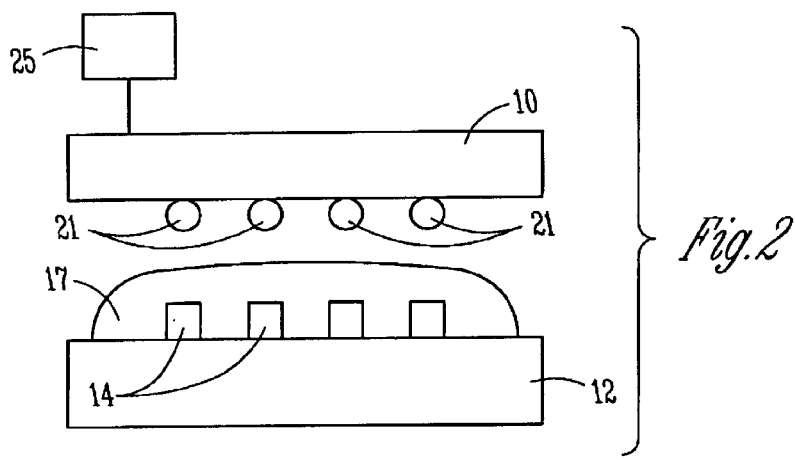
FIG. 2 is a view of a die and a substrate in a step according to the present invention.
Figure 3A:
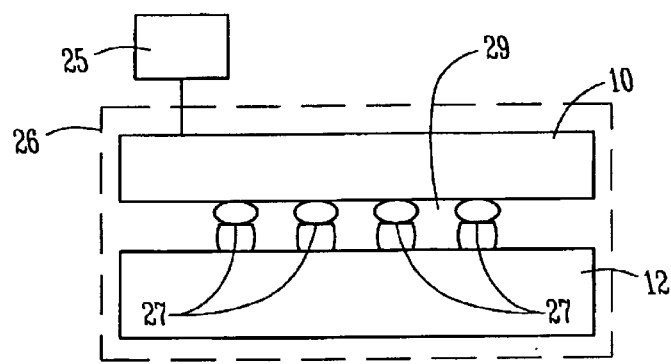
FIG. 3A is a view of a die/substrate assembly in a step according to the present invention.

FIGS. 1, 2, and 3A show steps in a no-flow underfill process for connecting a die 10 to a substrate 12 according to the teachings of the present invention. In an embodiment, substrate 12 is a surface mount technology device. In an embodiment, substrate 12 is a printed circuit board. In an embodiment, substrate 12 is a ball grid array device. In an embodiment, substrate 12 is a chip scale package. The substrate 12 includes at least one interconnect 14 for connecting the substrate to a die 10. In an embodiment, substrate 12 includes a plurality of interconnects 14. The interconnects 14, in an embodiment, are pads. In an embodiment, the interconnects 14 are bumps or balls. In an embodiment, the interconnects 14 are free of flux. An underfill dispenser 15 distributes a no-flow, flux-free underfill material 17 onto the upper surface of the substrate 12. The no-flow, flux-free underfill material 17, in an embodiment, completely fills the interstices 19 between the interconnects 14.

The die 10 includes at least one integrated circuit formed therein. The integrated circuit, in an embodiment, includes a memory device. In an embodiment, the integrated circuit includes a processor or logic circuits. As shown in FIG. 2, die 10 further includes at least one interconnect 21 that is electrically connected to the integrated circuit. In an embodiment, die 10 includes a plurality of interconnects. In an embodiment, the interconnects 21 are free of flux. Interconnects 21 provide inputs to the integrated circuit and outputs from the integrated circuit. A chip placement tool 25 grips the die 10 and aligns the die interconnects 21 with the substrate interconnects 14. In an embodiment, die interconnects 21 are formed on the top most layer or level of the die 10. That is, the die interconnects 21 are one of the last layers or elements fabricated on the die. The chip placement tool 25, in this embodiment, grips the die 10, flips it, and then aligns the die interconnects 21 with the substrate interconnects 14.

As shown in FIG. 3A, the aligned die 10 and substrate 12 are positioned in a processing chamber 26. As is recognized by one of skill in the art, most oxide on interconnect 14 or 21 must be removed before they can be joined into joints 27. The processing chamber 26 includes a means for removing the oxide. The means for removing the oxide does not include a flux. In an embodiment, chamber 26 includes a plasma source that bathes the die interconnects 21 in plasma, which removes the oxide coating from the interconnects 21. In an embodiment, the plasma source bathes the substrate interconnects 14 in plasma to remove the oxide from the substrate interconnects 14. The chamber 26 then heats the interconnects 14 and/or 21 to a reflow temperature. At this reflow temperature, at least one of the die interconnects 21 and the substrate interconnects 14 is reflowed to create joints 27. The reflowing of the interconnect 14 or 21 includes heating the material of the interconnect to a temperature causing the interconnect 14 or 21 to flow. In an embodiment, tool 25 applies pressure to the interconnects 14, 21 during the reflow. The joints 27 form an integral electrical and physical connection between the die and the substrate. In an embodiment, joints 27 are solder joints. In an embodiment, the solder joints include lead. In an embodiment, the solder joints 27 include eutectic tin/lead solder (melting point of 183 degrees C.). In an embodiment, the solder joints 27 include lead/indium solder (melting point of 220 degrees C.).

The plasma source in the chamber 26 removes oxide from at least one of the interconnects 14 and 21. The plasma source accordingly creates a plasma that reacts with the oxide to remove it from the interconnects. In an embodiment, the plasma source includes a plasma accelerator. In an embodiment, the plasma source includes a plasma engine. In an embodiment, the plasma source includes a plasma occillator. In an embodiment, the plasma source includes a plasma torch. In an embodiment, the plasma source includes a plasma gun. The plasma source produces a plasma having sufficient energy to remove, i.e., clean, oxide off the interconnects 14 or 21 while not harming the die 10 or substrate 12. In an embodiment, the plasma is a flourine plasma. The flourine plasma may be created from $SF_6$ or $CF_4$. In an embodiment, the plasma treatment of the interconnects 14, 21 is performed at room temperature, e.g., 18 to 28 degrees Celsius. In an embodiment, the plasma treatment occurs at a temperature less than the reflow temperature of at least one of the interconnects. An example of a temperature less than the reflow temperature is less than about 100 degrees Celsius.

In an embodiment, chamber 26 includes a thermal source that transforms the chamber 26 into a reducing oven. The reducing oven removes the oxide from at least one of the interconnects 14, 21. In an embodiment, the reducing oven includes a reducing flame that has excess fuel and is capable of a chemical reaction, such as removing an oxide from a metallic oxide thereby leaving the metal. It will be appreciated that the reducing oven must operate at a temperature below the reflow temperature of the interconnects 14, 21 and must not exceed the thermal budget of the chip or die 10.

Joints 27 are by themselves susceptible to breaking and cracking due to the die 10 and substrate 12 having different coefficients of thermal expansion. That is, temperature effects on the assembly of the die 10 and substrate 12 can cause the joints to electrically open or physically fail. Accordingly, the assembly of the die 10 and substrate 12 includes no-flow, flux-free underfill material 17. Underfill material 17 provides additional physical support between the die and the substrate to prevent cracking of the joints. In an embodiment, the underfill material insulates the joints from each other and the die from the substrate. The underfill material 17 is cured from a flowable material, which was dispensed by underfill dispenser 15, into a solid, essentially rigid material within the interstices 19 between the joints 27 and opposed surfaces of the die 10 and the substrate 12. In an embodiment, the underfill material 17 is hardened by the heating. In an embodiment, the underfill material 17 is heated to essentially the same temperature as the reflow temperature of the interconnects 14 or 21. In an embodiment, the underfill material 17 is heated to a temperature greater than the reflow temperature of the interconnects. An example of an underfill curing temperature is about 165–170 degrees Celsius. Another example of an underfill curing temperature is about 185 degrees Celsius. Another example of an underfill curing temperature is about 190 degrees Celsius. Another example of an underfill curing temperature is about 195 degrees Celsius. Still another example of an underfill curing temperature is over about 200 degrees Celsius. The underfill material 17, in an embodiment, includes a polymeric material. The underfill material 17, in an embodiment, includes an epoxy resin. In an embodiment, underfill material 17 includes at least one of a catalyst and a hardener. The underfill 17, when cured, is an insulator between the joints 27. Additionally, cured underfill 17 acts as a support mechanism between the die 10 and substrate 12 to minimize the residual thermal stress resulted from the curing process and subsequent temperature effects on the die/substrate assembly.

In an embodiment, the no-flow, flux-free underfill material 17 is a film type underfill. The film type underfill is deposited as a film on the either the surface of the chip or the surface of the substrate. In an embodiment, the underfill material is cast onto a release paper and then dried into a film. The underfill film is cut into a proper shape, called a preform, and applied to the chip or substrate. It will be understood that the underfill film, in an embodiment, is applied to a wafer including a plurality of chips or dies. Heating, with the application of pressure, causes the underfill film to bond to the chip or substrate. In order to apply the interconnects 21 to the underfill-coated chip, wafer or substrate, openings are formed in the underfill film at each interconnect location 14, 21. In one embodiment, the openings are formed using laser machining techniques. Excimer lasers, for example, are used to create openings in underfill films by a photoablation process in which ultra-violet radiation causes the long-chain polymers of the underfill film to break down into small volatile by-products. Patterning is achieved using either a pattern mask or a directed beam. Optical defraction grating patterning methods are also used. Photoablation is used as it produces only a minimum amount of heating and does not damage the chip, wafers or substrate. The patterning process parameters are set so that patterning stops when the layer below the underfill is exposed, thereby making the process self-limiting. This is not always necessary, however, since many materials, e.g. metals, are resistant to laser ablation. Although UV lasers are described, other lasers, such as infrared (IR) lasers can be used as well.

In an embodiment, the no-flow, flux-free underfill material 17 begins its curing process at a temperature less than the reflow temperature of interconnect 14 or 21. The underfill material 17 begins to cure but a rate slow enough to allow the interconnects to be joined prior to the underfill curing to such an extent that it is not sufficiently flowable to allow creation of the joint. In this embodiment, it is not necessary to heat the die/substrate assembly 10, 12 above the reflow temperature. In an embodiment, the underfill material 17 is held at a temperature above a minimum curing temperature for a sufficient time to cure the underfill material but not reflow the joint 27.

The no-flow, flux-free underfill of the present invention includes several important criteria. In an embodiment, the no-flow underfill has a minimal curing reaction below solder bump reflow temperature (about 180–230 degrees Celsius). In an embodiment, the no-flow underfill has a rapid curing reaction after the solder bump reflow temperature is reached. In an embodiment, the no-flow underfill has good adhesion to passivation layer, chip, substrate, or solder mask. In an embodiment, the no-flow underfill has minimal shrinkage during curing. In an embodiment, the no-flow underfill include a low TCE. In an embodiment, the no-flow underfill includes a self-fluxing ability. In an embodiment, the no-flow underfill includes an adequate modulus to minimize the residual thermal stress resulted from the curing process and sequence temperature cycling condition.

The height of the joints 27 determine the void 29 that exists in the die/substrate assembly 10, 12. Void 29 is substantially filled by underfill 17. In an embodiment, void 29 is completely filled by underfill 17. The height of the joints 27 and hence the height of the void 29 is kept as small as possible to reduce the size of the die/substrate assembly 10, 21. However, the joints 27 have a minimal size to ensure that enough metal remains on the interconnects 14 or 21 after the oxide, which forms on the metal, is removed. The remaining metal must be sufficient to reflow and create a stable mechanical and electrical bond between the interconnects 14, 21. In an embodiment, the joints 27 have a height of less than 100 microns. In an embodiment, the joints 27 have a height of greater than 75 microns. In an embodiment, the joints 27 have a height of about 75 microns. In an embodiment, the heights of the interconnects 14, 21 that form the joints have a combined height of greater than the height of the joint 27. This allows for removal of a portion of the metal with the oxide. This further allows the interconnects to collapse during reflow. Accordingly, with a sufficient collapse, the underfill material 17 applied onto the substrate 12 does not need to extend above the substrate interconnects 14 to provide an adequate support mechanism between the die and substrate. In an embodiment, the height of at least one of the interconnects 14, 21 is on the order of nanometers. The only limitation on the size of the interconnects is the need to keep the interconnects from being totally oxidized before the oxide removal process, e.g., plasma treatment, occurs.

Figure 3B:
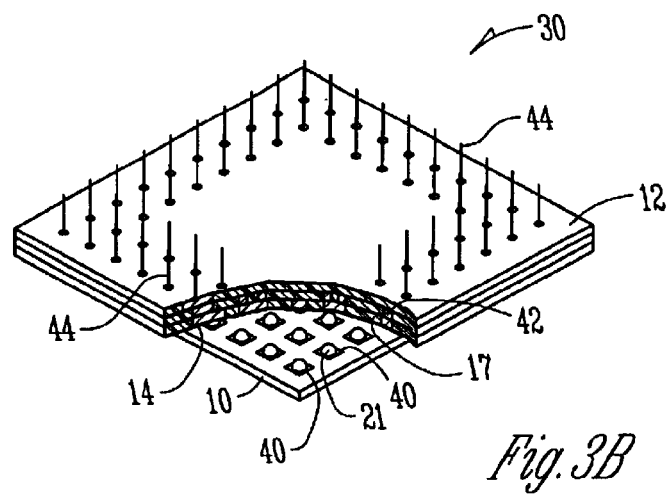
FIG. 3B is a partial cut-away, perspective view of a die/substrate assembly according to the teachings of the present invention.

FIG. 3B shows a die/substrate assembly 30 according to the teachings of the present invention. Assembly 30 includes a die 10 and a substrate 12. The die 10 includes a plurality of pads 40 on which interconnects 21 are formed. Substrate 12 includes a plurality of interconnects 14 facing the die 10. Cured no-flow, flux-free underfill 17 fills the gaps between the joined substrate interconnects 14 and chip interconnects 21. The cured underfill 17 provides mechanical support between the die 10 and substrate 12. The substrate 12 further includes electrically conductive vias 42 that join the substrate interconnects 14 to pins 44. The pins 44 provide electrical connections to electrical circuits (not shown) outside the assembly 30.

Figure 4:
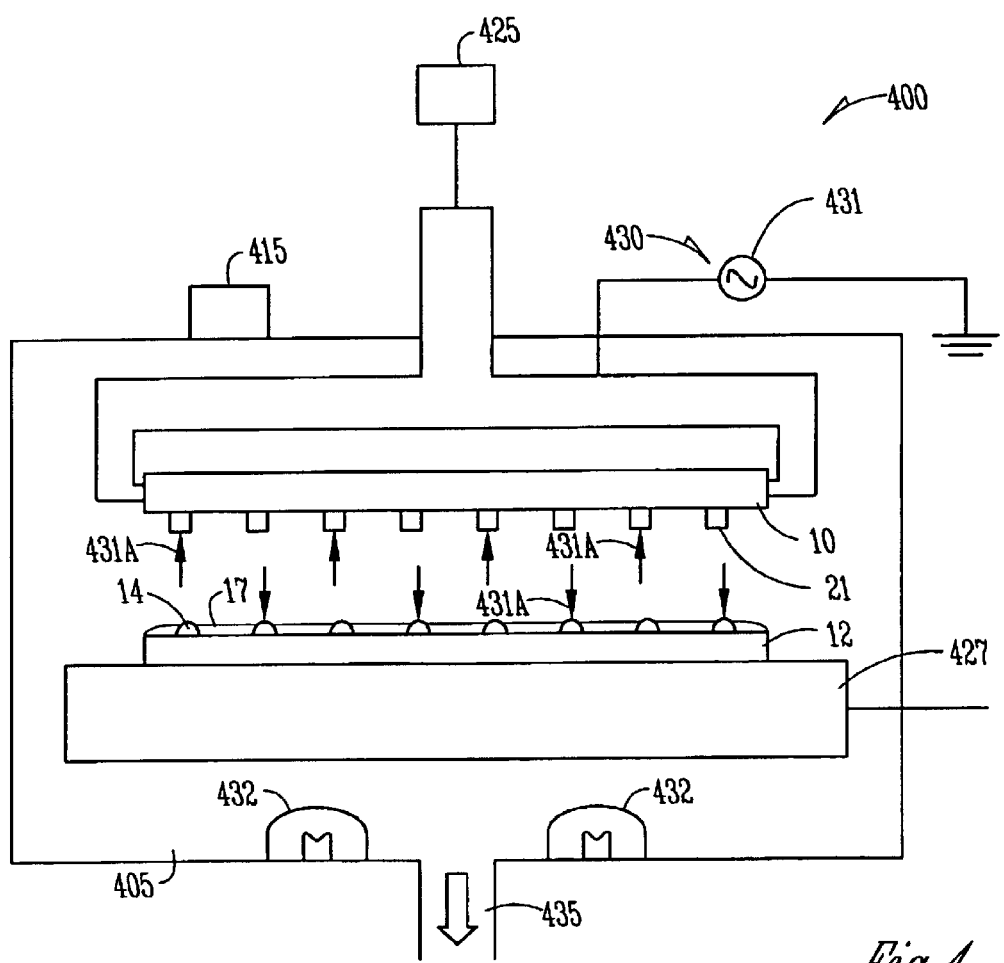
FIG. 4 is a schematic view of an assembly chamber which can be used to perform the process of the invention.

FIG. 4 shows a fabrication device 400 for joining the die 10 to the substrate 12. Fabrication device 400 includes a reaction chamber 405 in which the substrate 12 and die 10 are positioned. In an embodiment, chamber 405 is adapted to receive a plurality of substrates 12 and dies 10. Device 400 includes a no-flow underfill dispenser 415 which dispenses a flowable (e.g., dispensable) no-flow, flux-free underfill 17 onto substrate 12. In another embodiment no-flow dispenser 415 is an applicator for applying a film type underfill 17 onto one of the die 10 and substrate 12. In an embodiment, an oxide removal means 430 removes oxide from the substrate interconnects 21 prior to dispensing the no-flow, flux-free underfill 17 onto the substrate. In an embodiment, dispenser 415 applies the no-flow, flux-free underfill 17 prior to removing the oxide from the substrate interconnects 14. The oxide removal means 430, in an embodiment, includes a plasma source 431. The plasma source 431 removes oxide from the substrate interconnects 14 in an embodiment. In an embodiment, plasma source 431 removes oxide from the chip interconnects 21. Plasma source 431, in an embodiment, has a gas source (not shown) and a ionization device (not shown) for ionizing the gas supplied by the gas source to create the plasma. The ionization device includes a solid state radio frequency generator for ionizing the gas in an embodiment. Plasma 431A contacts the die interconnects 21 and reacts with the oxide on the interconnects 21 in an embodiment. Plasma 431A removes the oxide from the die interconnects 21. In an embodiment, plasma 431A contacts the substrate interconnects 14 and reacts with the oxide on the interconnects 14 in an embodiment. Plasma 431A removes the oxide from the substrate interconnects 14. In an embodiment, the oxide removal means includes at least one thermal source 432. The thermal source 432, in its oxide removing capacity, increases the temperature in the chamber 405 thereby creating a reducing oven that removes oxide from at least one of the substrate interconnects 14 and chip interconnects 21. A chip holder 425 holds chip 10 within the chamber 405. A substrate holder 427 supports the substrate 12 in the chamber 405. In an embodiment, chip holder 425 is movable within the chamber 405. Chip holder 425 grips the chip 10, flips it, and aligns its interconnects 21 with the substrate interconnects 14. Thereafter, chip holder 425 moves the chip interconnects 21 into contact with substrate interconnects 14. Thermal source 432 raises the temperature of the chamber 405 to a reflow temperature, which results in at least one of the chip interconnects 21 and substrate interconnects 14 to reflow and to form joints 27. In an embodiment, thermal source 432 holds the temperature in the chamber 405 at a minimum temperature to cause the no-flow underfill to cure. Thermal source 432, in an embodiment, holds the minimum temperature for a period of time so that the no-flux, flux-free underfill 17 is cured. Chamber 405 further includes an exhaust 435, which removes by-product gases from the underfill curing process, removes heated ambient gases from the chamber, or removes the plasma gases from the chamber.

Figure 5:
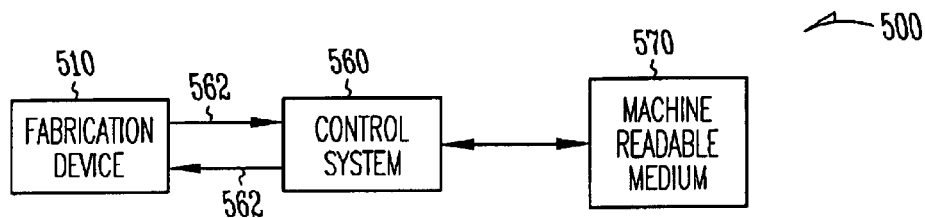
FIG. 5 is a block diagram of an assembly system according to the teachings of the present invention.

FIG. 5 shows a fabrication system 500 according to the teachings of the present invention. System 500 is adapted to join die 10 to substrate 12 to create a die/substrate assembly 10, 12. System 500 includes a fabrication device 510 that joins the die 10 to the substrate 12 and a control unit 560. In an embodiment, device 510 is the same as fabrication device 400 as described herein. Device 510 communicates through lines 562 with control unit 560 such that control instructions are passed from the control unit 560 to fabrication device 510 and feedback regarding the status of fabrication unit is sent to the control unit 560. It is noted that communication lines 562 may be only one physical line, in which communications are bidirectional.

The control system 560 may include, integrally or separatable therefrom, a machine readable media 570 which contains instructions for performing the present invention. Media 570 may be an electrical, magnetic, optical, mechanical, etc. storage device that stores instructions that are read by control unit 560. Such storage devices include magnetic disks and tape, optical disks, computer memory, etc. Control unit 560 may also include a processor (not shown) for issuing instructions to control fabrication device 510 based upon instructions read from machine readable media 570.

Circuit Modules

Figure 6:
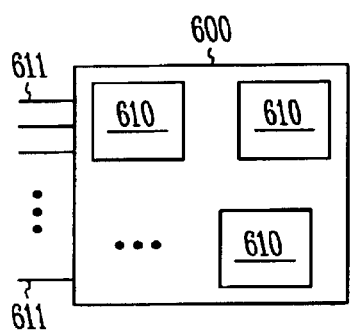
FIG. 6 is a view of a circuit module according to the teachings of the present invention.

FIG. 6 shows a circuit module 600 that includes at least one die/substrate assembly 610 according to the teachings of the present invention. Assembly 610 includes the die 10 and substrate 12 as described herein. In an embodiment, assembly 610 includes a protective casing, which protects the die, substrate and joints from environmental contaminants. In an embodiment, circuit module 600 includes a plurality of assemblies 610 to enhance or extend the functionality of an individual assembly 610. Circuit module 600 may be a combination of assemblies 610 representing a variety of functions, or a combination of assemblies 610 containing the same functionality. One or more assemblies 610 of circuit module 600 contain at least one assembly in accordance with the invention.

Some examples of a circuit module include memory modules, device drivers, power modules, communication modems, processor modules and application-specific modules, and may include multilayer, multichip modules. Circuit module 600 may be a subcomponent of a variety of electronic systems, such as a clock, a television, a cell phone, a personal computer, an automobile, an industrial control system, an aircraft and others. Circuit module 600 will have a variety of leads 611 extending therefrom and coupled to the assemblies 610 providing unilateral or bilateral communication and control.

Figure 7:
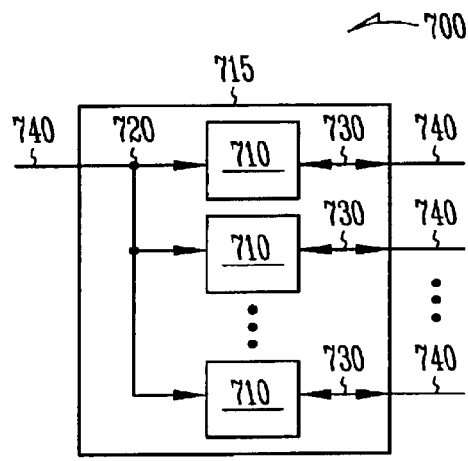
FIG. 7 is view of a memory module according to the teachings of the present invention.

FIG. 7 shows one embodiment of a circuit module as memory module 700. Memory module 700 contains multiple memory devices 710 contained on support 715, the number generally depending upon the desired bus width and the desire for parity. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions shown in FIG. 7. At least one of the memory devices 710 contains an assembly according to the teachings of the present invention.

Electronic Systems

Figure 8:
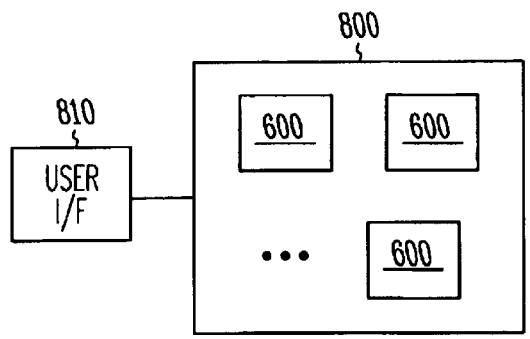
FIG. 8 is a view of an electronic system according to the teachings of the present invention.

FIG. 8 shows one embodiment of an electronic system 800 containing one or more circuit modules 600. Electronic system 800 generally contains a user interface 810. User interface 810 provides a user of the electronic system 800 with some form of control or observation of the results of the electronic system 800. Some examples of user interface 810 include the keyboard, pointing device, monitor or printer of a personal computer; the tuning dial, display or speakers of a radio; control of a music playing device; the ignition switch, gauges or gas pedal of an automobile; and the card reader, keypad, display or currency dispenser of an automated teller machine. User interface 810 may further describe access ports provided to electronic system 800. Access ports are used to connect an electronic system to the more tangible user interface components previously exemplified. One or more of the circuit modules 600 may be a processor providing some form of manipulation, control or direction of inputs from or outputs to user interface 810, or of other information either preprogrammed into, or otherwise provided to, electronic system 800. As will be apparent from the lists of examples previously given, electronic system 800 will often be associated with certain mechanical components (not shown) in addition to circuit modules 600 and user interface 810. It will be appreciated that the one or more circuit modules 600 in electronic system 800 can be replaced by a single integrated circuit. Furthermore, electronic system 800 may be a subcomponent of a larger electronic system. It will also be appreciated that at least one of the circuit modules 600 contains an assembly according to the teachings of the present invention.

Figure 9:
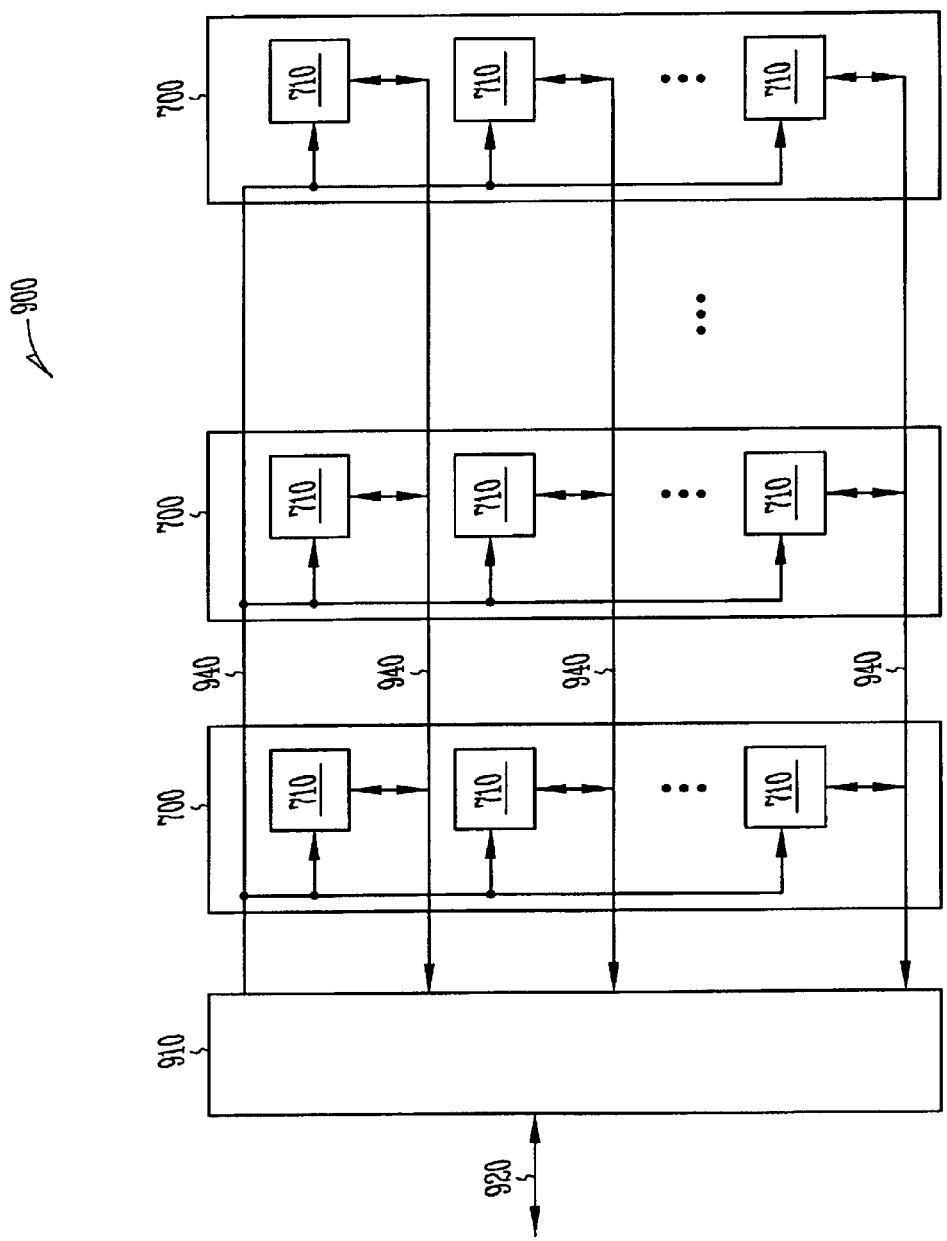
FIG. 9 is a view of an embodiment of an electronic system according to the teachings of the present invention.

FIG. 9 shows one embodiment of an electronic system as memory system 900. Memory system 900 contains one or more memory modules 700 and a memory controller 910. The memory modules 700 each contain one or more memory devices 710. At least one of memory devices 710 contains an assembly according to the teachings of the present invention. Memory controller 910 provides and controls a bidirectional interface between memory system 900 and an external system bus 920. Memory system 900 accepts a command signal from the external bus 920 and relays it to the one or more memory modules 700 on a command link 90. Memory system 90 provides for data input and data output between the one or more memory modules 700 and external system bus 920 on data links 940. It will also be appreciated that at least one of the memory modules 700 contains an assembly according to the present invention.

Figure 10:
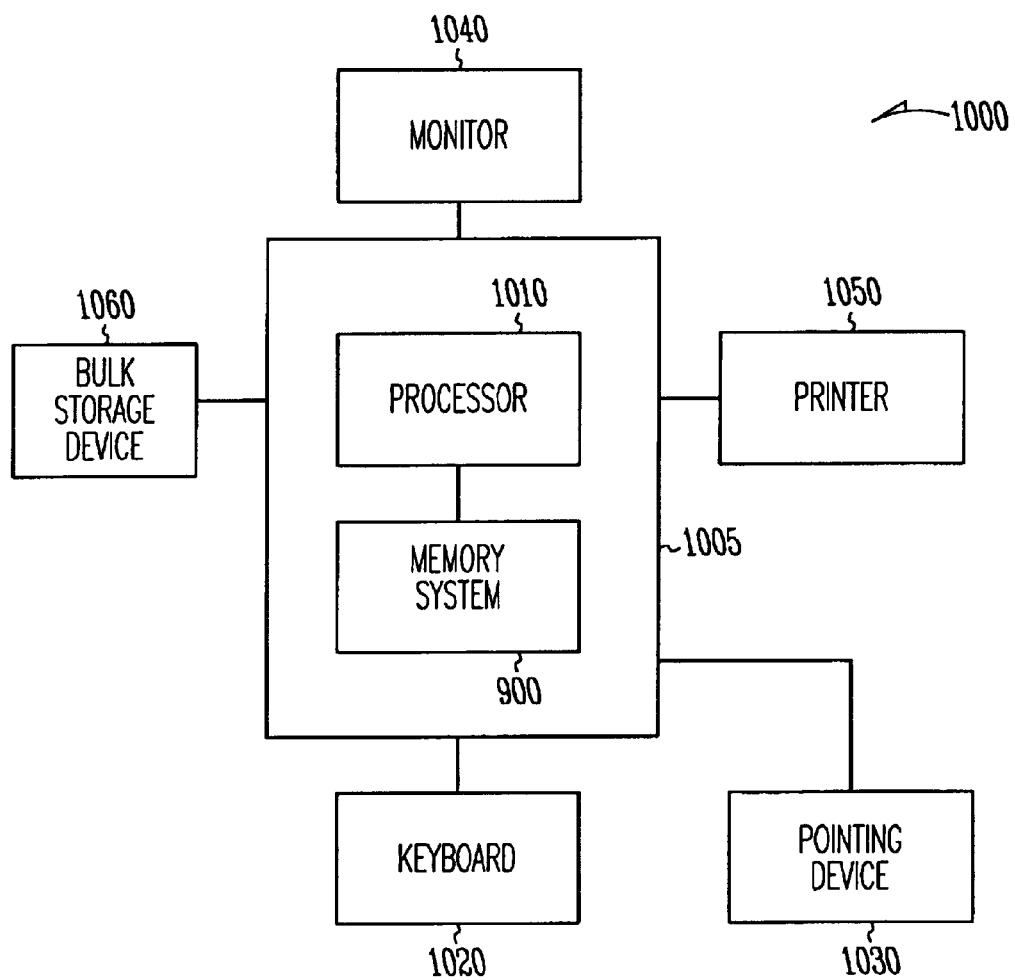
FIG. 10 is a view of a computer system according to the teachings of the present invention.

FIG. 10 shows a further embodiment of an electronic system as a computer system 1000. Computer system 1000 contains a processor 1010 and a memory system 900 housed in a computer unit 1005. Computer system 1000 is but one example of an electronic system containing another electronic system, i.e., memory system 900, as a subcomponent. Computer system 1000 optionally contains user interface components. Depicted in FIG. 10 are a keyboard 1020, a pointing device 1030, a monitor 1040, a printer 1050 and a bulk storage device 1060. It will be appreciated that other components are often associated with computer system 1000 such as modems, device driver cards, additional storage devices, etc. It will further be appreciated that the processor 1010 and memory system 900 of computer system 1000 can be incorporated on a single integrated circuit. Such single package processing units reduce the communication time between the processor and the memory circuit. It will be appreciated that at least one of the processor 1010 and memory system 900 contain an assembly according to the teachings of the present invention.

Figure 11:
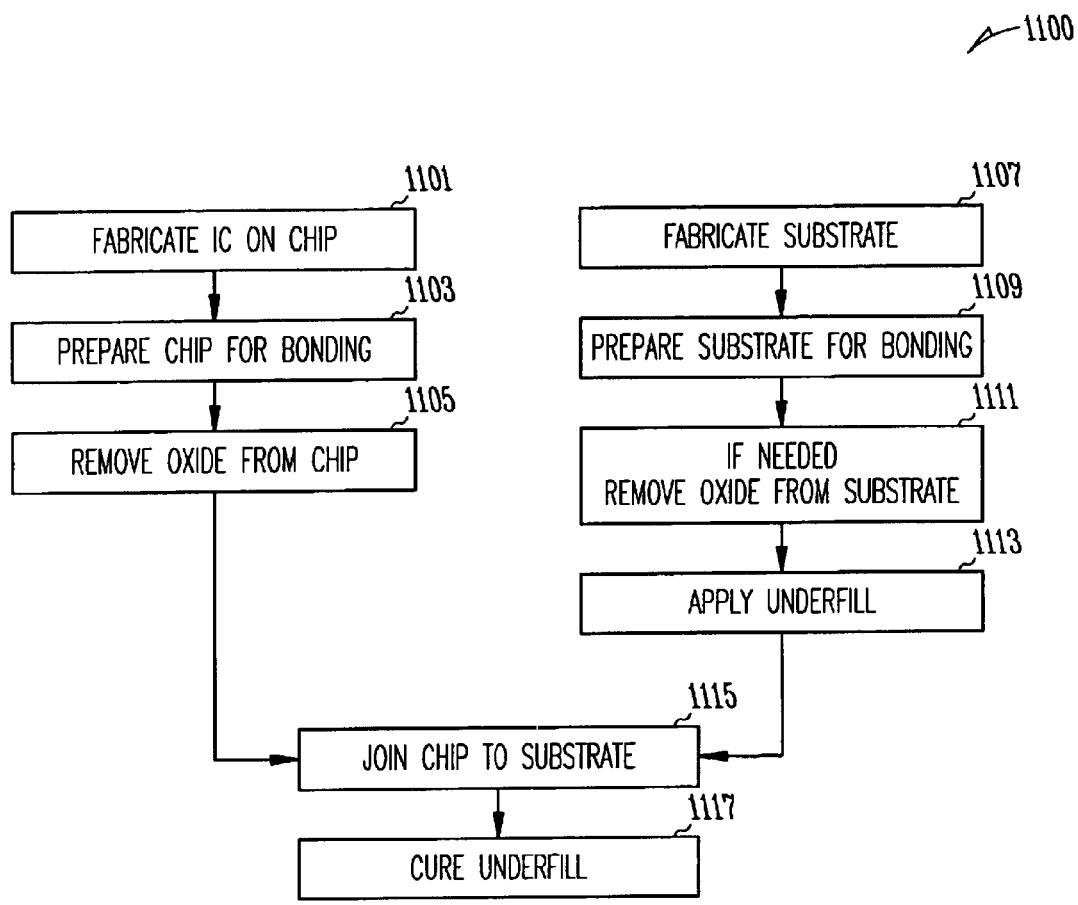
FIG. 11 is a flow chart of an embodiment of processing steps according to the teachings of the present invention.

FIG. 11 shows a flow chart 1100 according to the teachings of the present invention. A die containing an integrated circuit is fabricated on a wafer, step 1101. The die fabrication step includes fabricating integrated circuits, forming interconnects on the wafer, and dicing the wafer. In an embodiment, the die is fabricated as a flip-chip including interconnects, such as solder bumps, on its top level. The die is prepared for bonding, step 1103. The oxides are removed from the die interconnects, step 1105. The removal of the oxide, in an embodiment, includes plasma treating the interconnects to remove surface oxides from the interconnects. In an embodiment, die preparation includes placing the die, or the wafer before dicing, in a reducing oven to remove the surface oxide. However, flux is not applied to interconnects on the die. A substrate is fabricated in step 1107. The substrate fabrication includes forming interconnects on the substrate. Other steps involved with forming the substrate are understood by one of skill in the art. In an embodiment, the interconnects on the substrate are prepared for bonding, step 1109. However, flux is not applied to interconnects on the die. In an embodiment, both the die and the substrate are prepared for bonding according to the teachings of the present invention. Oxide on at least one of the die interconnects or the substrate interconnects is removed, step 1111. Removal of the oxide is necessary to provide a good wetting of the interconnect material to create a stable joint. Oxide on the interconnects raises the reflow temperature and prevents formation of a stable joint within the thermal budget of the chip. Using a flux on the interconnects is a conventional method for removing oxide, but it introduces many drawbacks. In an embodiment of the present invention, removing the oxide includes plasma treating the die interconnects. In an embodiment, removing the oxide includes plasma treating the substrate interconnects. In an embodiment, removing the oxide includes placing one of the die and the substrate in a reducing oven to use thermal treatment to remove the oxide. The substrate receives a non-flow, no-flux underfill material, step 1113. The interconnects on the die are joined to the interconnects on the substrate, step 1115, without application of a flux. An adequate joint is produced without flux as the oxides are removed from the interconnects of the substrate and the die. Joining the interconnects includes aligning the respective interconnects and reflowing at least one of the interconnects to create a joint that include both the die interconnects and the substrate interconnects. In an embodiment, the aligned interconnects are pressed together during the heating thereof to a reflow temperature. The flux-free, no-flow underfill material is cured, step 1117. Accordingly, the assembly of the die and the substrate is complete.

It will be appreciated that some of the above steps as described with respect to FIG. 11 may be simultaneously performed or performed in a different order than recited above. For example, it is within the scope of the present invention to first fabricate the substrate and thereafter fabricate the die.

CONCLUSION

Fluxes that are used in removing oxides from interconnects to join chips to substrates introduce additional steps in fabrication, e.g., packaging, processes. The present invention provides a method for joining chips to substrates without a fluxing step. It is desirable to eliminate the flux from the process to reduce the steps involved with fabrication. It is desirable to eliminate the flux from the process to not leave flux residue that interferes with adhesion and complete void filling by capillary underfills. It is further desirable to join chips to substrates without the use of flux because the flux reduces the potlife of no-flow underfill and the glass transition temperature of the underfill. Both of these drawbacks of using flux reduce the number of materials that are used as underfill. Removal of the flux will expand the number of materials that can be used as an underfill when joining a chip to a substrate.

An embodiment of the present invention includes using a no-flow, i.e., non-capillary, underfill. When compared to the standard assembly process using capillary underfilling processes, the present invention does not require a cleaning step to remove all of the flux residue after joining the chip to the substrate. The cleaning step and the capillary underfill step of the conventional process requires that the space between the chip and substrate remain large enough to insert cleaning solution, remove the cleaning solution and provide the needed flow of the underfill between the chip and substrate. Accordingly, the present invention allows for smaller ball or interconnect sizes than are believed presently used. Moreover, the present invention removes the cleaning solution related steps all together. Thus, the present invention allows the void between the chip and substrate to be scaled to a smaller size than conventional processes.

The present underfill material does not require a very active acid group to provide a flux effect to adhere to the substrate or chip. The oxides are removed, for example, by plasma treatment from the substrate and the chip. Accordingly, the underfill may include a less active acid group. Accordingly, the number of materials for the underfill and the formulations thereof are increased.

The present invention also does not require cleaning of the flux from the assembly prior to the application of the underfill. The chip/substrate assembly is thus cleaner due to no flux residue and no cleaning solution residue. The underfill thus is not degraded by the presence of residues during its curing.

The invention claimed is:

1. A method, comprising:
   forming bumps on an integrated circuit chip;
   removing oxide from bumps in a nitrogen atmosphere;
   applying flux free, no-flow underfill to a substrate; and
   fluxlessly connecting the bumps to pads on the substrate.

2. The method of claim 1, wherein forming bumps includes forming solder bumps.

3. The method of claim 1, wherein forming bumps includes forming bumps including at least on of lead and tin.

4. The method of claim 1, wherein applying no-flow underfill occurs before fluxlessly connecting the bumps to the pads.

5. The method of claim 1, wherein forming bumps includes forming bumps having a height less an about 100 microns.

6. The method of claim 1, wherein forming bumps includes forming bumps having a height less an about 75 microns.

7. A method, comprising:
   forming bumps on an integrated circuit chip by patterning flux and depositing bump material on the patterned flux, such that an interconnection side of the bumps is flux-free;
   plasma treating the bumps to remove oxide from bumps;
   applying flux-free, no-flow underfill to a substrate; and
   fluxlessly connecting the interconnection side of the bumps to pads on the substrate.

8. The method of claim 7, wherein plasma treating the bumps removes a surface oxide from the bumps.

9. The method of claim 7, wherein plasma treating the bumps removes oxide from the bumps without applying chemical cleaning solutions to the bumps.

10. The method of claim 7, wherein plasma treating the bumps removes oxide from the bumps without applying a flux to the bumps.

11. The method of claim 7, wherein applying flux-free, no-flow underfill occurs before fluxlessly connecting the bumps to the pads.

12. A method, comprising:
    forming bumps on an integrated circuit chip by patterning flux and depositing bump material on the patterned flux, such that an interconnection side of the bumps is flux-free;
    heat treating he bumps to remove oxide from bumps in a nitrogen atmosphere;
    applying flux-free, no-flow underfill to a substrate; and
    fluxlessly connecting the interconnection side of the bumps to pads on the substrate.

13. The method of claim 12, wherein heat treating includes placing the integrated circuit chip in a reducing oven.

14. A method, comprising:
    forming bumps on an integrated circuit chip;
    heat treating he bumps to remove oxide from bumps;
    applying flux-free, no-flow underfill to a substrate; and
    fluxlessly connecting the bumps to pads on the substrate, wherein heat treating includes placing the integrate circuit chip in a nitrogen atmosphere, reducing oven.

15. The method of claim 12, wherein heat treating the bumps removes oxide from the bumps without applying chemical cleaning solutions to the bumps.

16. The method of claim 12, wherein heat treating the bumps removes oxide from the bumps without applying a flux to the bumps.

17. The method of claim 12, wherein applying flux-free, no-flow underfill occurs before fluxlessly connecting the bumps to the pads.

18. A method for joining a flip-chip to a substrate, comprising:
    forming solder balls on at least one of the flip-chip and the substrate by applying flux and patterning the solder balls on the patterned flux;
    applying flux-free, no-flow underfill on the other of the flip-chip and the substrate;
    plasma treating the solder balls;
    aligning the flip-chip to the substrate; and
    reflowing th solder balls to join the flip-chip to the substrate.

19. The method of claim 18, wherein plasma treating includes removing oxides from the solder ball.

20. A method for joining a flip-chip to a substrate, comprising:
    forming solder balls on at least one of the flip-chip and the substrate, wherein forming solder balls includes applying a flux to the at least one of the flip-chip and the substrate and then patterning solder into solder balls on the flux, such that an interconnection side of the solder balls is flux-free;
    applying flux-free, no-flow underfill on the other of the flip-chip and the substrate;
    plasma treating the solder balls;
    aligning the flip-chip to the substrate; and
    reflowing the solder balls to join the flip-chip to the substrate.

21. The method of claim 20, wherein applying the flux includes patterning the flux on the at least o e of the flip-chip and the substrate.

22. The method of claim 18, wherein applying flux-free, no-flow underfill includes applying a polymeric material.

23. The method of claim 18, wherein applying flux-free, no-flow underfill includes applying epoxy resin.

24. A method for joining a flip-chip to a substrate, comprising:
    forming solder balls on the flip-chip by applying flux and patterning solder balls on the flux;
    applying flux-free, no-flow underfill on the substrate;
    plasma treating the solder balls to remove oxide from the solder balls;
    aligning the flip-chip to the substrate;
    heating the aligned flip-chip and substrate to reflowing the solder balls to join the flip-chip to the substrate; and
    curing the flux-free, no-flow underfill.

25. The method of claim 24, wherein heating the aligned flip-chip and substrate includes heating to a first temperature; and wherein curing the flux-free, no-flow underfill includes heating the underfill to a second temperature higher than the first temperature.

26. The method of claim 25, wherein the heating to the first temperature includes heating to at least about 180 degrees Celsius.

27. The method of claim 25, wherein the heating to the first temperature includes heating to a range of about 210–235 degrees Celsius.

28. The method of claim 25, wherein heating the underfill to the second temperature include heating the underfill to at least about 190 degrees Celsius.

29. The method of claim 25, wherein heating the underfill to the second temperature include heating the underfill to at least about 200 degrees Celsius.

30. The method of claim 24, wherein applying flux-free, no-flow underfill on the substrate includes applying an epoxy resin, a catalyst and a hardener on the substrate.

31. The method of claim 24, wherein applying flux-free, no-flow underfill on the substrate includes applying an organic acid-free underfill.

32. A method, comprising:

forming bumps on an integrated circuit chip;

heat treating the bumps by placing the integrated circuit chip in a nitrogen atmosphere, reducing oven to remove oxide from bumps;

applying flux-free, no-flow underfill to a substrate; and fluxlessly connecting the bumps to pads on the substrate.

33. The method of claim 32, wherein heat treating the bumps removes oxide from the bumps without applying chemical cleaning solutions to the bumps.

34. The method of claim 32, wherein heat treating the bumps removes oxide from he bumps without applying a flux to the bumps.

35. The method of claim 32, wherein applying flux-free, no-flow underfill occurs before fluxlessly connecting the bumps to the pads.

36. The method of claim 32, wherein forming bumps includes forming solder bumps.

37. The method of claim 32, wherein forming bumps includes forming bumps including at least one of lead and tin.

38. The method of claim 18, wherein reflowing includes reflowing the solder balls absent a flux on an interconnection side of the solder balls and in the underfill.

39. The method of claim 20, wherein plasma treating the solder balls and reflowing the solder balls occurs after pattering the solder balls on the flux.

40. The method of claim 18, wherein the steps are performed in the order recited.

41. The method of claim 20, wherein applying flux-free, no-flow underfill includes applying a polymeric material.

42. The method of claim 20, wherein applying flux-free, no-flow underfill includes applying an epoxy resin.

43. The method of claim 20, wherein plasma treating the solder balls removes oxide from The solder balls without applying chemical cleaning solutions to the solder balls.

44. The method of claim 20, wherein plasma treating the solder balls removes oxide from The solder balls without applying a flux to the solder balls.

45. The method of claim 20, wherein applying flux-free, no-flow underfill occurs before fluxlessly reflowing the solder balls.

* * * * *

UNITED STATES PATENT AND TRADEMARK OFFICE
CERTIFICATE OF CORRECTION

PATENT NO. : 6,926,190 B2
DATED : August 9, 2005
INVENTOR(S) : Jiang et al.

It is certified that error appears in the above-identified patent and that said Letters Patent is hereby corrected as shown below:

Column 11,
Line 5, delete "system 90" and insert -- system 900 --.

Column 13,
Line 5, delete "flux free" and insert -- flux-free --.
Line 10, delete "on" and insert -- one --.
Lines 15 and 19, delete "an" and insert -- than --.
Lines 46 and 57, delete "he" and insert -- the --.
Line 60, delete "integrate" and insert -- integrated --.

Column 14,
Line 14, delete "th" and insert -- the --.
Line 17, delete "ball." and insert -- balls. --.
Line 33, delete "least o e" and insert -- least one --.
Line 38, after "applying" insert -- an --.
Lines 63 and 66, delete "include" and insert -- includes --.

Column 15,
Line 19, delete "he" and insert -- the --.

Column 16,
Lines 16 and 19, delete "The" and insert -- the --.

Signed and Sealed this

Twentieth Day of December, 2005

JON W. DUDAS
*Director of the United States Patent and Trademark Office*